US010634696B2

(12) United States Patent
Mohammed et al.

(10) Patent No.: US 10,634,696 B2
(45) Date of Patent: Apr. 28, 2020

(54) MULTI-AXIS ACCELEROMETERS WITH REDUCED CROSS-AXIS SENSITIVITY

(71) Applicant: Khalifa University of Science and Technology, Abu Dhabi (AE)

(72) Inventors: Zakriya Mohammed, Abu Dhabi (AE); Waqas Amin Gill, Abu Dhabi (AE); Mahmoud Rasras, Abu Dhabi (AE)

(73) Assignee: Khalifa University of Science and Technology, Abu Dhabi (AE)

( * ) Notice: Subject to any disclaimer, the term of this patent is extended or adjusted under 35 U.S.C. 154(b) by 209 days.

(21) Appl. No.: 15/846,386

(22) Filed: Dec. 19, 2017

(65) Prior Publication Data
US 2018/0188283 A1 Jul. 5, 2018

Related U.S. Application Data

(60) Provisional application No. 62/436,390, filed on Dec. 19, 2016.

(51) Int. Cl.
*G01P 15/125* (2006.01)
*G01P 15/08* (2006.01)
(Continued)

(52) U.S. Cl.
CPC .......... *G01P 15/13* (2013.01); *G01C 19/5712* (2013.01); *G01P 15/125* (2013.01); *G01P 15/18* (2013.01); *H01L 29/84* (2013.01); *B81B 2201/0235* (2013.01); *B81B 2203/051* (2013.01); *B81B 2203/055* (2013.01);
(Continued)

(58) Field of Classification Search
CPC .......... G01P 15/08; G01P 15/125; G01P 15/18
See application file for complete search history.

(56) References Cited

U.S. PATENT DOCUMENTS

2007/0238212 A1* 10/2007 Merassi ................ G01P 15/125
438/48
2010/0058864 A1* 3/2010 Hsu ........................ G01P 15/125
73/514.32
(Continued)

OTHER PUBLICATIONS

Wala Saadeh et al., A Hybrid OFDM Body Coupled Communication Transceiver for Binaural Hear Aids in 65nm CMOS, 2015, IEEE, 978-1-4799-8391-9/15, 4 pages.
(Continued)

*Primary Examiner* — Herbert K Roberts
(74) *Attorney, Agent, or Firm* — Billion & Armitage; Benjamin C. Armitage

(57) ABSTRACT

A multi-axis accelerometer may include a proof mass, a first electrode set, and a second electrode set. The first electrode set may detect acceleration along a second axis of the accelerometer, and may include a first electrode (C1) and a second electrode (C2). The second electrode set may detect acceleration along a first axis of the accelerometer that is orthogonal to the second axis, and may include a third electrode (C3) and a fourth electrode (C4). Application of a force along only the second axis may result in the exhibition of a non-zero change in differential capacitance between at least C1 and C2, but a zero net change in the differential capacitance between at least C3 and C4. As such, the accelerometer may exhibit little or no cross axis sensitivity in response to the applied force.

18 Claims, 7 Drawing Sheets

(51) Int. Cl.
*G01P 15/13* (2006.01)
*G01C 19/5712* (2012.01)
*G01P 15/18* (2013.01)
*H01L 29/84* (2006.01)

(52) U.S. Cl.
CPC .. *G01P 2015/082* (2013.01); *G01P 2015/084* (2013.01); *G01P 2015/0848* (2013.01)

(56) References Cited

U.S. PATENT DOCUMENTS

| | | | |
|---|---|---|---|
| 2010/0122579 A1* | 5/2010 | Hsu | G01P 15/125 |
| | | | 73/514.32 |
| 2011/0120221 A1* | 5/2011 | Yoda | B81B 3/0086 |
| | | | 73/514.32 |
| 2017/0082519 A1* | 3/2017 | Blomqvist | B81B 3/001 |

OTHER PUBLICATIONS

Zakriya Mohammed, et al., Double-Comb-Finger Design to Eliminate Cross-Axis Sensitivity in a Dual-Axis Accelerometer, IEEE Sensors Letters, vol. 1, No. 5, Oct. 2017, 4 pages.

* cited by examiner

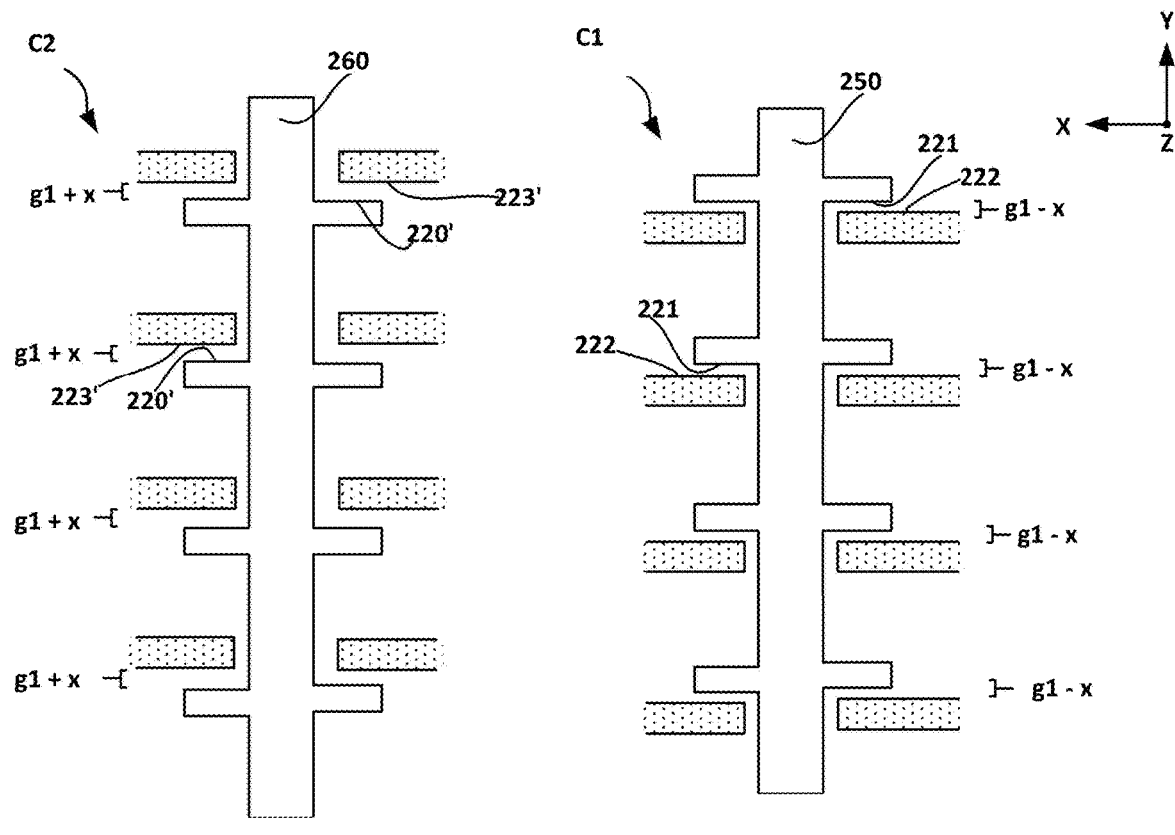
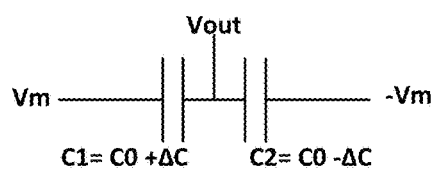
FIG. 2C

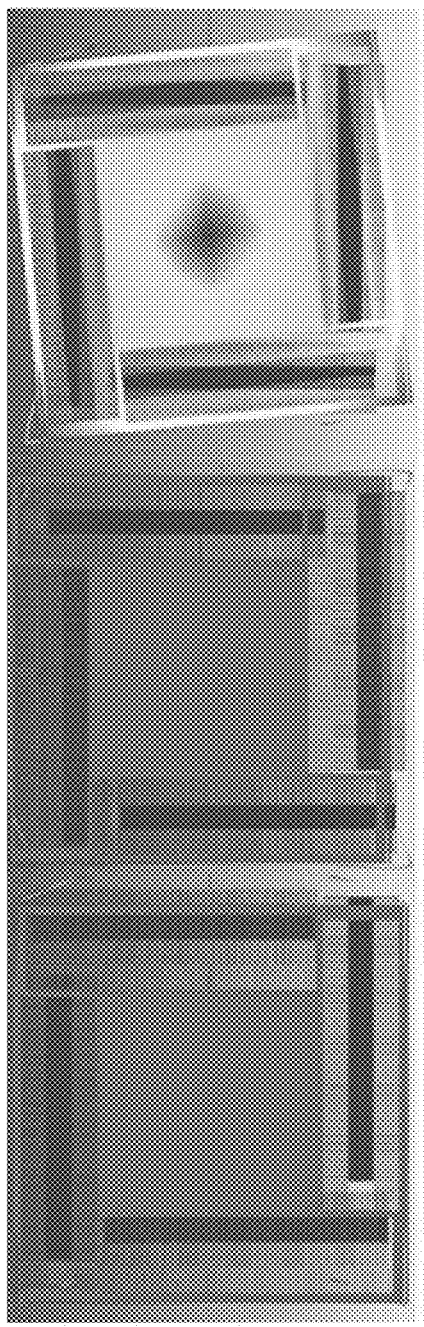

MULTI-AXIS ACCELEROMETERS WITH REDUCED CROSS-AXIS SENSITIVITY

CROSS REFERENCE TO RELATED APPLICATIONS

This application claims the benefit of priority to U.S. Provisional Application No. 62/436,390, filed Dec. 19, 2016, the entire content of which is incorporated by reference.

FIELD

The present disclosure generally relates to accelerometers and, more specifically, to multi-axis accelerometers with reduced cross-axis sensitivity.

BACKGROUND

An accelerometer is a sensor which detects/measures acceleration due to gravity and/or an applied force (e.g., from physical motion). Such devices have numerous applications in the automotive, consumer products, and other industries. Although various accelerometer configurations are known, capacitive accelerometers (which detect/measure acceleration by converting a capacitance change into a proportional voltage) are popular due to their relatively low power and noise, their relatively high sensitivity, and their relatively small device footprint.

While accelerometers are now in widespread use, they may suffer from one or more drawbacks such as cross-axis sensitivity. Cross-axis sensitivity is the output detected on one axis (the sensing axis) of an accelerometer that is due to acceleration imposed on another axis (e.g., an orthogonal axis, which may also be referred to as the cross direction). The percentage cross-axis sensitivity is often expressed as a ratio of the measured sensitivity in the cross direction to the measured sensitivity in the sensing direction.

As noted above, capacitive accelerometers convert a detected change in capacitance to a proportional voltage that is representative of the acceleration of a proof mass. With such designs, cross-axis sensitivity can cause a capacitance change to be detected in one axis when acceleration is occurring along another axis of the accelerometer, potentially resulting in sensing errors. Indeed as cross axis sensitivity increases, the relative accuracy of an accelerometer may decrease. Many current commercial grade accelerometers have relatively high (≥2%) cross axis sensitivity, which may make them unsuitable for high precision applications. Although cross-axis sensitivity may be reduced by using several accelerometers in parallel, such an approach may undesirably increase the cost of the device. Hence, the development of new accelerometer designs that address the cross-axis sensitivity issue remain of interest.

BRIEF DESCRIPTION OF THE DRAWINGS

Features and advantages of the claimed subject matter will be apparent from the following detailed description of embodiments consistent therewith, which description should be considered with reference to the accompanying drawings, wherein:

FIG. 2C is a magnified view of the first and second electrodes of the accelerometer of FIG. 2A, when a force is applied along one (e.g., negative Y) axis and, due to spring restoring force, a proof mass and associated rotors are displaced in a positive Y axis.

FIGS. 3A-3C are plan views of an example mode shapes when accelerometer of FIG. 2A responding to an acceleration in one or more dimensions, consistent with embodiments of the present disclosure.

DETAILED DESCRIPTION

Figure 1:
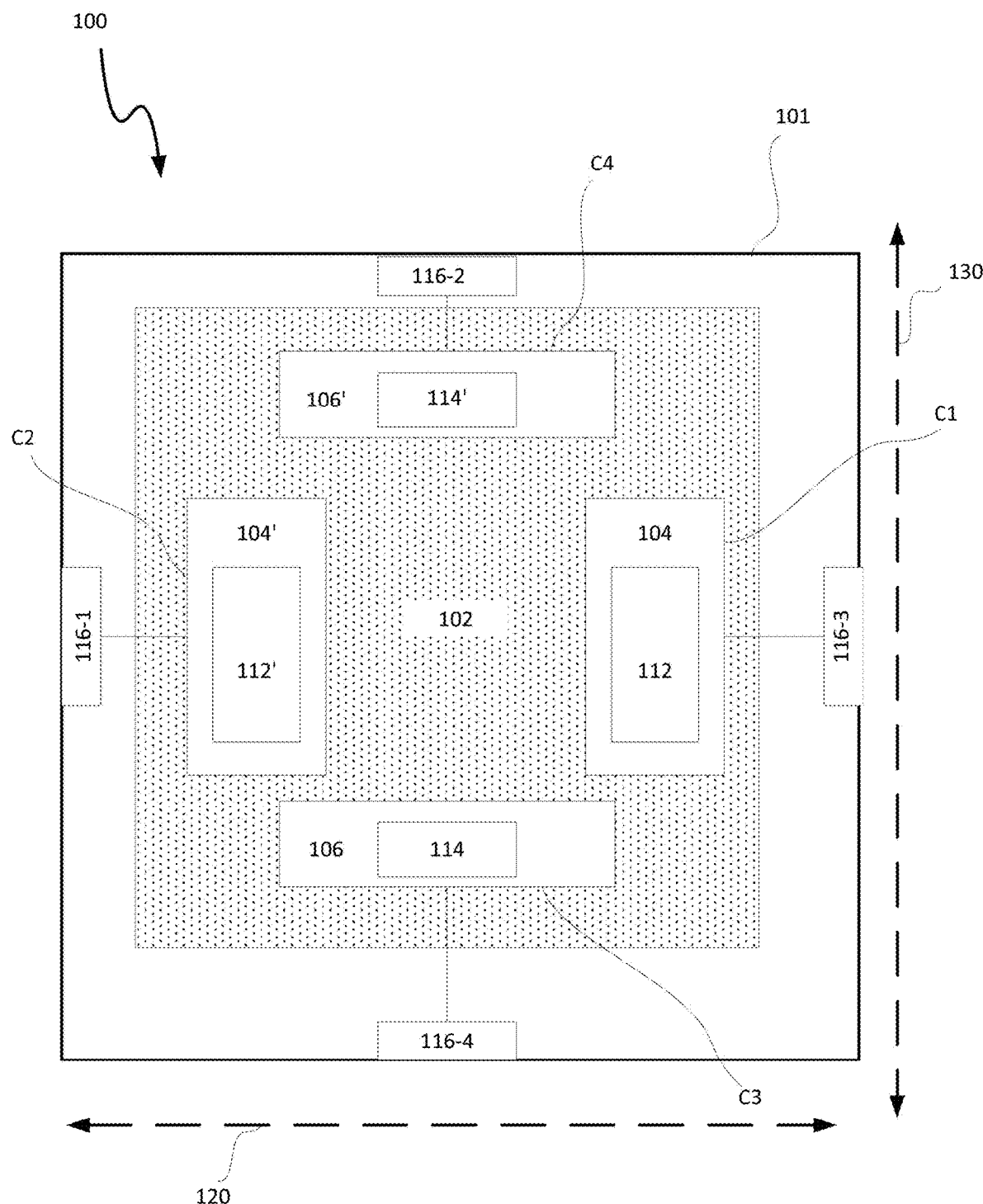
FIG. 1 is a block diagram of one example of an accelerometer consistent with the present disclosure.

Multi-axis accelerometers are designed to detect acceleration in two or more axes, e.g., the X, Y, and/or Z axes. Some current multi-axis accelerometers, however, can suffer from relatively high cross-axis sensitivity between two orthogonal axes (e.g., the X and Y axes, the X and Z axes, and/or the Y and Z axes). High cross-axis sensitivity can lead to measurement errors, which may be problematic for high precision applications.

The present disclosure is generally directed to multi-axis accelerometers that mitigate or even eliminate the effect of cross-axis sensitivity between two or more orthogonal axes. In embodiments the multi-axis accelerometers described herein are configured as a relatively high sensitivity 2-axis or 3-axis micro electromechanical (MEM) accelerometer, in which acceleration of a proof mass along a first axis, second axis, and optionally a third axis is detected using a change in differential capacitance between rotors and stators in two or more electrodes. In embodiments the multi-axis accelerometers described herein may have a detection sensitivity of about 70 femto Farads per g (Ff/g), about 80 fF/g, about 90 fF/g or more, where g is 9.8 meters per second squared (M/s$^2$) or, equivalently, 9.8 Newtons per kilogram (N/kg). The accelerometers described herein may also achieve a mode separation (e.g., of about 4.6 kHz) between in-plane and out-of plane modes which may significantly reduce cross-axis sensitivity between the two directions. Such accelerometers may be manufactured to relatively small dimensions (e.g., with a footprint of less than 2 square millimeters (mm), such as a foot print of 1.5 mm×1.5 mm).

The multi-axis accelerometers described herein may also be configured such that cross-axis sensitivity between at least two orthogonal axes of the device is mitigated or eliminated. For example, in embodiments the accelerometers described herein exhibit no (0) cross axis sensitivity between the X and Y axes (also referred to as "in-plane axes), between the X and Z axes, and/or between the Y and Z axes. In further embodiments, the multi-axis accelerometers described herein exhibit no (0) cross-axis sensitivity between at least the X and Y axes. And in still further embodiments, the multi-axis accelerometers described herein exhibit no (0) cross-axis sensitivity between the X and Y axes, and between one or both of the X and Z axes and the Y and Z axes. The accelerometers described herein may therefore be of particular use in applications in which little or no cross-axis sensitivity is desired, such as high precision applications.

For the sake of illustration and ease of understanding, example accelerometers consistent with the present disclosure are described in the form factor of a multi-axis micro electromechanical (MEM) accelerometer. It should be understood that the accelerometers of the present disclosure are not limited to the form factor of a MEM device, and may be constructed to any suitable scale.

The multi-axis accelerometers described herein generally include a proof mass, a first electrode set, and a second electrode set. The first electrode set includes at least a first electrode proximate a first side of the proof mass and a second electrode proximate a second side of the proof mass, wherein the first and second sides are opposite or substantially opposite one another. The second electrode set includes at least a third electrode proximate a third side of the proof mass and a fourth electrode proximate a fourth side of the proof mass, wherein the third and fourth sides are opposite (or substantially opposite) one another, and are orthogonal (or substantially orthogonal) to the first and second sides of the proof mass.

Each of the first, second, third, and fourth electrodes includes a rotor set and a stator set. Each rotor set includes two or more rotors, and each stator set includes two or more stators. Each of the rotors may be integral with or otherwise coupled to the proof mass. The proof mass and each of the rotors may be coupled to one or more springs or other elastically deformable components, which in turn are coupled to a base, such as a substrate of a MEM device. IN embodiments, the spring(s) or other elastically deformable member(s) suspend or support the proof mass and rotors from or above the substrate. In response to an applied force (e.g., due to gravity or physical motion), the proof mass and each of the rotors may be physically displaced from a default (at rest) position. The degree to which such components are displaced by the applied force may depend on the spring constant (stiffness coefficient) of the spring or other elastically deformable member, the magnitude of the force, and/or other factors.

In contrast, the stators are configured such that their position does not (or does not substantially) change in response to an applied force. Thus for example, each stator may be integral with or coupled to a stator body, which in turn is integral with or coupled to a substrate or other suitable base. Movement of the stators described herein may, therefore, be limited by the degree to which the materials forming the stator may bend or otherwise deform in response to the applied force. In embodiments the stators are configured such that they do not bend or otherwise deform in response to an applied force within a designed operating range of the accelerometer.

The rotors and stators are positioned relative to one another such that each electrode includes at least two capacitive pairs, wherein one of the capacitive pairs is disposed proximate a first side of a stator body, and the other of the capacitive pairs is disposed proximate a second side of the stator body that is opposite or substantially opposite the first side of the stator body. Each of the capacitive pairs has a default (static) capacitance when the accelerometer is in an at rest condition and a measuring voltage (Vm) is applied. For convenience, the default capacitance of each capacitive pair is referred to herein as "$C_0$," and may be calculated using formula (I) below:

$$C_0 = \frac{\in A}{g}. \qquad \text{I}$$

where $\in$ is the permittivity of the material forming the rotors and stators, A is the effective capacitive area between the rotors and stators, and g is the spacing between the rotors and stators. Notably, $C_0$ may be the same for all capacitive pairs, or it may differ between capacitive pairs. Differences in $C_0$ between capacitive pairs may be attributable to various factors, such as differences in the spacing of rotors in stators in different capacitive pairs, difference in the effective capacitive area of different capacitive pairs (e.g., due to variations in the degree to which rotors and stators overlap), etc.

In embodiments the first electrode set (or, more specifically, the capacitive pairs therein) may be configured to detect acceleration along a second axis (e.g., the Y axis), whereas the second electrode set (or, more specifically, the rotors and stators therein) may be configured to detect acceleration along a first axis that is orthogonal to the second axis (e.g., the X axis). Thus, when a force is applied to the accelerometer (e.g., due to gravity, motion, etc.) along only the second axis (e.g., only the Y axis) the force may displace the rotor(s) in the first and second electrode sets. Such displacement may change the gap spacing of the capacitive pairs in the first electrode set, resulting in a detectable change in differential capacitance between the first and second electrodes (C1 and C2) that, in turn, can be converted to acceleration along the second axis (sensing direction). In contrast, the displacement in the first direction may cause little or no change in the gap spacing or overall capacitive effective area of the capacitive pairs in the second electrode set (C3 and C4). Consequently, little or no change in the differential capacitance between the third and fourth electrodes will arise, thereby mitigating or even eliminating the effect of cross-axis sensitivity along the first axis due to a force applied only along the second axis.

Similarly, the first and second electrode sets may be configured such that when a force is applied to the accelerometer only along a first axis (e.g., only the X axis) the force may displace the rotors in the first and second electrode sets in the first direction (i.e., along the first axis). That displacement may change the gap spacing of the capacitive pairs in the second electrode set, resulting in a detectable change in differential capacitance between the third and fourth electrodes that, in turn, can be converted to acceleration along the second axis (sensing direction). In contrast, the displacement in the second direction may cause little or no change in the gap spacing or overall capacitive effective area of the capacitive pairs in the first electrode set. Consequently, little or no change in the differential capacitance between the first and second electrodes will arise, thus mitigating or even eliminating the effect of cross-axis sensitivity along the first axis due to a force applied only along the second axis.

Still further, in embodiments the first and second electrode sets may be configured such that when a force is applied to the accelerometer only along a third axis (e.g., only the Z axis) the force may displace the rotors in the first and second electrode sets in a first direction and/or a second direction that is that is orthogonal or substantially orthogonal to the first direction. Such displacement may cause capacitance of the electrodes in each of the first and second electrode sets to change by the same amount. Because the accelerometers described herein determine acceleration based on differential capacitance and because the capacitance of each of the electrodes may change by the same amount (and the same sign) in response to acceleration only along the third axis, little or no net change in differential capacitance between the first and second electrodes and between the third and fourth electrodes will arise—thus mitigating or even eliminating the effect of cross-axis sensitivity along the first and second axes due to a force applied only along the third axis.

Put differently, in embodiments the accelerometers described herein are configured to detect acceleration due to a force imparted along a second (e.g., Y) axis from a change in differential capacitance between a first electrode set, and to detect acceleration due to a force imparted along a first axis (e.g., X) from a change in differential capacitance between a second electrode set. The first electrode set includes at least first and second electrodes, and the second electrode set includes at least third and fourth electrodes. The first and second electrodes are positioned relative to first and second opposing sides of a proof mass, and the third and fourth electrodes are positioned relative to third and fourth opposing sides of the proof mass. Each of the first, second, third, and fourth electrodes include at least two capacitive pairs, each of which is formed by a rotor coupled to the proof mass and a stator coupled to a stator body.

Each of the first through fourth electrodes may include a stator body and two or more stators, wherein the two or more stators are in the form of protuberances or "fingers" that extend from opposing sides of the stator body. In such embodiments the rotors in each electrode may include or be in the form of protuberances or "fingers" that extend from the proof mass. Each of the rotors is positioned relative to a corresponding one of the stators in the electrode such that each electrode includes at least first and second capacitive pairs that are disposed on opposing sides of a corresponding stator body, with each capacitive pair defined by at least one rotor and at least one stator.

The rotor and stator protuberances or "fingers" in the first electrode set may be oriented along a first direction, whereas the rotor and stator protuberances or "fingers" in the second electrode set may be oriented along a second direction that is orthogonal or substantially orthogonal to the first direction. Rotors in the first electrode and third electrodes may be disposed proximate a first side of their corresponding stator, whereas rotors in the second electrode may be disposed proximate a second side of their corresponding stator. As a result, a force imparted along a second axis (e.g., Y) may produce a detectable change in the differential capacitance of the first electrode set, but may produce little or no change in the differential capacitance of the second electrode set. Likewise, a force imparted along a first axis (e.g., X) may produce a detectable change in the differential capacitance of the second electrode set, but may produce little or no change in the differential capacitance of the first electrode set. Similarly, a force imparted along a third axis (e.g., Z) may produce little or no change in the differential capacitance of the first and second electrode sets. Thus, the accelerometers of the present disclosure may exhibit little or no cross axis sensitivity.

Reference is now made to FIG. 1, which is a block diagram of one example of an accelerometer 100 consistent with the present disclosure. For context, accelerometer 100 is described herein in the form of MEM accelerometer, but as noted above the accelerometers described herein are not limited to a MEM form factor. With that in mind, accelerometer 100 is in the form of a MEM accelerometer that is formed from or includes one or more device structural layers. The device structural layers may be made of any suitable material, such as but not limited to low resistance single crystalline silicon.

Accelerometer 100 includes a substrate 101, a proof mass 102, a first electrode set, and a second electrode set. The first and second electrode sets may include any suitable number of electrodes, provided that the number of electrodes therein may be equally distributed on two opposing sides of the proof mass 102. In embodiments, the first electrode set includes a first electrode C1 and a second electrode C2, and the second electrode set includes a third electrode C3 and a fourth electrode C4. Each of the first, second, third, and fourth electrodes (C1-C4) include a rotor set and a stator set. More specifically, first electrode C1 includes a first rotor set 104 and a first stator set 112. The second electrode C2 includes a second rotor set 104' and a second stator set 112'. The third electrode C3 includes a third rotor set 106 and a third stator set 114. And the fourth electrode C4 includes a fourth rotor set 106' and a fourth stator set 114'.

In the embodiment of FIG. 1, the first and second electrodes C1, C2 are disposed proximate to opposing first and second sides (respectively) of the proof mass 102, and the third and fourth electrodes are disposed proximate to opposing third and fourth sides (respectively) of the proof mass 102. The first and second sides of the proof mass 102 are orthogonal or substantially orthogonal to the third and fourth sides of the proof mass, respectively.

Each of the rotor sets (104, 104', 106, 106') is integral with or coupled to the proof mass 102, and the proof mass 102 and each of the rotor sets (104, 104', 106, 106') are suspended from or supported over the substrate 101 by a spring or other elastically deformable member (not shown). The proof mass 102 and each of the rotor sets (104, 104', 106, 106') each have a default position while accelerometer 100 is at rest, but may be displaced in response to an applied force (e.g., due to gravity or motion of the accelerometer 101). The degree to which the proof mass 102 and the rotors in the rotor sets (104, 104', 106, 106') are displaced by the applied force may depend on the spring constant (stiffness coefficient) of the spring or other elastically deformable member, the magnitude of the applied force, and/or other factors.

In contrast, each of the stator sets (112, 112', 114, 114') is configured such that it remains stationary (or substantially stationary) in response to an applied force. In that regard, each of the stator sets (112, 112', 114, 114') may include a stator body that is integral with or otherwise coupled to substrate 101, and stators within the stator sets (112, 112', 114, 114') may be integral with or coupled to a respective one of the stator bodies. Thus, movement of stators in the stator sets (112, 112', 114, 114') in response to an applied force may be inhibited or prevented.

Each of the rotor sets (104, 104', 106, 106') include a plurality of rotors. The number of rotors in each rotor set is not limited, provided that the number of rotors is at least two and the rotors may be equally distributed on opposing sides of a stator body of a corresponding stator set. In embodiments the number of rotors in each of the rotor sets (104, 104', 106, 106') is 2 or greater than 2. Thus, for example, each of the rotor sets (104, 104', 106, 106') may include 2, 4, 6, 8, 10, 12, 14, 16, 18, 20 or more rotors.

The rotors in each of the rotor sets (104, 104', 106, 106') may have any suitable geometry. In embodiments, the rotors in each of the rotor sets (104, 104', 106, 106') are in the form of protuberances or "fingers" that extend from or are otherwise coupled to the proof mass 102. In some embodiments the rotors are in the form of protuberances or "fingers" that have a long axis that extends in oriented parallel to one of a first axis 120 (e.g., the X axis) or a second axis 130 (e.g., the Y axis) of the accelerometer. In embodiments the rotors of the first electrode set (i.e., of the first and second electrodes C1, C2) are in the form of rectangular protuberances or "fingers" that extend from or are otherwise coupled to the proof mass 102, and which have a long dimension that is parallel to the first axis 120 (e.g., the X axis) of the accelerometer 100. In contrast, the rotors of the second electrode set (i.e., of the third and fourth electrodes C3, C4) may be in the form of rectangular protuberances or "fingers" that extend from or are otherwise coupled to the proof mass 102, and which have a long dimension that is parallel to the second axis 130 (e.g., the Y axis) of the accelerometer 100.

Each of the stator sets (112, 112', 114, 114') include a stator body (not shown) and a plurality of stators. The number of stators in each of the stator sets is not limited, provided it is greater than two and an equal number of stators may be equally distributed on opposing sides of a corresponding stator body. In embodiments the number of stators in each of the stator sets (112, 112', 114, 114') is 2 or greater than 2. Thus, for example, each of the stator sets (112, 112', 114, 114') may include 2, 4, 6, 8, 10, 12, 14, 16, 18, 20 or more stators.

The stators in each of the stator sets (112, 112', 114, 114') may have any suitable geometry. In embodiments, the stators in each of the stator sets (112, 112', 114, 114') are in the form of protuberances or "fingers" that extend from or are otherwise coupled to a stator body of a corresponding one of the stator sets. In some embodiments the stators are in the form of protuberances or "fingers" that have a long axis that extends from a stator body and which have a long dimension that is oriented parallel to the first axis 120 or the second axis 130 of the accelerometer. For example, in embodiments the stators of the first electrode set (i.e., of the first and second electrodes C1, C2) may be in the form of rectangular protuberances or "fingers" that extend from or are otherwise coupled to a corresponding first or second stator body, and have a long dimension that is parallel to the first axis 120 (i.e., the X axis) of the accelerometer 100. In contrast, the stators of the second electrode set (i.e., of the third and fourth electrodes C3, C4) may be in the form of rectangular protuberances or "fingers" that extend from or are otherwise coupled to a corresponding third or fourth stator body, and have a long dimension that is parallel to the second axis 130 (i.e., the Y axis) of the accelerometer 100.

As will be explained further in connection with FIGS. 2A-2D, the rotors in each of the rotor sets (104, 104', 106, 106') is positioned relative to a corresponding one of the stators in stator sets (112, 112', 114, 114'), so as to form a capacitive pair. As a result, each of the electrodes (C1, C2, C3, and C4) include two or more capacitive pairs (e.g., 2, 4, 6, 8, 10 or more), with each capacitive pair defined by at least one rotor and at least one stator. The number of capacitive pairs in each electrode is not limited, provided that an equal number of capacitive pairs can be disposed on at least two opposing sides of a stator body in the electrode.

For example, each electrode (C1, C2, C3, C4) may include at least a first capacitive pair and a second capacitive pair, wherein the first capacitive pair is formed by a first rotor and a first stator extending from or coupled to a first side of a stator body, and the second capacitive pair is formed by a second rotor and a second stator extending from or coupled to a second side of the stator body that is opposite or substantially opposite the first side of the stator body. In some embodiments the first and second rotors/stators are in the form of protuberances or fingers, and are arranged relative to and in parallel with one another such that a gap is present between them. In such instances each capacitive pair may be thought of as a parallel plate capacitor, wherein one plate of the capacitor is formed from a rotor protuberance (or "finger"), and the other plate of the capacitor is formed from a stator protuberance (or "finger"). The capacitance of each of those capacitive pairs may depend on, among other things, the spacing between the rotor and stator (i.e. the gap spacing), the degree to which the rotor and stator overlap (i.e., the effective capacitive area), etc.

As noted above, the rotors and stators in each of the electrodes may be in the form of protuberances or fingers having a long axis that is oriented in parallel with one another, and in parallel with one of the two in-plane axes (120, 130) of the accelerometer 100. In such instances the gap between the rotor and stators in each capacitive pair may also have a long axis that is oriented in parallel with one of the two in-plane axes (120, 130). For example, rotors and stators in the first and second electrodes C1, C2, may be in the form of protuberances or "fingers" that are oriented in parallel with one another and with the first axis 120 of the accelerometer 100. In contrast, the rotors and stators in the third and fourth electrodes C3, C3, may be in the form of protuberances or "fingers" that are oriented in parallel with one another and with the second axis 130. As a result, the gap in the capacitive pairs of the first and second electrodes C1, C2 may have a long axis that is oriented in parallel with the first axis 120, and the gap in the capacitive pairs of the third and fourth electrodes may have a long axis that is oriented in parallel with the second axis 130.

In such a configuration a force applied only along the second axis 130 may cause a detectable change in the differential capacitance between the first and second electrodes C1, C2, but will not (or will not substantially) affect the differential capacitance between the third and fourth electrodes. More specifically, the force applied along the second axis 130 may change the gap spacing of capacitive pairs in the first and second electrodes C1 and C2—resulting in a detectable change in differential capacitance between those electrodes. However, that force will not (or will not substantially) change the gap spacing or the total effective capacitive area of the capacitive pairs in the third and fourth electrodes, thus resulting in little or no change in the differential capacitance between those electrodes. In that way, the above described configuration can eliminate the effect of cross axis sensitivity on the output corresponding to acceleration on the first axis 120 due to a force applied along the second axis 130.

Similarly, a force applied only along the first axis 120 may cause a detectable change in the differential capacitance between the third and fourth electrodes, but will not (or will not substantially) affect the differential capacitance between the first and second electrodes. More specifically, the force applied along the first axis 120 will change the gap spacing of capacitive pairs in the third and fourth electrodes C3 and C4—resulting in a detectable change in differential capacitance between those electrodes. However, that force will not (or will not substantially) change the gap spacing or the total effective capacitive area of the capacitive pairs in the first and second electrodes, C1, C2, thus resulting in little or no change in the differential capacitance between those electrodes. In that way, the above described configuration can eliminate the effect of cross axis sensitivity on the output corresponding to acceleration on the second axis 130 due to a force applied along the first axis 120. In sum, the electrode sets in the above described configuration self-correct for the issue of cross-axis sensitivity.

Put in other terms, each rotor and stator in a capacitive pair may be thought of as a capacitive plate (or other capacitive element), wherein the position of the rotor relative to the stator in the capacitive pair may change in response to an applied force (e.g., in response to acceleration along one or more axes). The rotors and stators included in each of the first through fourth electrodes may have a default position relative to one another when the accelerometer is at rest. In response to an applied force, rotors within the first and second electrodes may move relative to their corresponding stators, and rotors within the third and fourth electrodes may move relative to their corresponding stators.

Movement of the rotors relative to stators included within the capacitive pairs may affect the capacitance of the capacitive pair and, hence, the differential capacitance between the first and second electrodes and/or the third and fourth electrodes. The capacitance of each capacitive pair may be measured using a measuring voltage (Vm), which may be applied across each electrode and produce an output voltage (representative of a capacitance), which may be detected at one or more outputs (e.g., outputs 116-1 to 116-4) of the accelerometer 100. The generated output may be representative of one or more of the acceleration of the accelerometer 100 in response to an applied force, and/or noise attributable to cross-axis sensitivity.

For example, when a force is applied only in a direction parallel to the second axis 130, the difference between the output generated by capacitive pairs in the first and second electrodes C1, C2 may be representative of the acceleration applied along the second axis 130, whereas the difference between the output generated by the capacitive pairs in the third and fourth electrodes C3, C4 in response to that force may be due to cross-axis sensitivity. As mentioned above, however, the capacitive pairs of the electrodes described herein are configured to self-correct for cross-axis sensitivity, and thus reduce or even eliminate the impact of cross-axis sensitivity from the output generated by capacitive pairs that are oriented parallel to (or substantially parallel to) the sensing direction (in this case, the second axis 130). More specifically, because the accelerometers described herein measure acceleration based on differential capacitance of electrodes in an electrode set, the effect of cross-axis sensitivity in the cross axis direction may be reduced or eliminated by subtraction, as discussed further below. It is noted that while the present disclosure focuses on the use of this principal to address cross-axis sensitivity in the in-plane axes (e.g., in the X or Y axis), the effect of cross-axis sensitivity resulting from a movement in an out of plane axis (e.g., a z-axis) to both in plane axes may also be accounted for in the same manner.

Reference is now made to FIGS. 2A-2D, which are various views of another example of an accelerometer 200 consistent with the present disclosure. Like the accelerometer of FIG. 1, accelerometer 200 is a MEMs accelerometer that includes a proof mass, 102, a first electrode C1, a second electrode C2, a third electrode C3, and a fourth electrode C4. The first and second electrodes C1, C2 make up a first electrode set, and the third and fourth electrodes C3, C4, make up a second electrode set.

The first electrode C1 is disposed proximate a first side of the proof mass 102, and includes a first rotor set and a first stator set. The first rotor set includes a plurality of first rotors 204 in the form of protuberances or "fingers" that extend from the proof mass 102 in a direction parallel to a first axis of the accelerometer, which in this case is the X-axis. The first stator set includes a first stator body 250 and a plurality of first stators 212. The plurality of first stators are in the form of protuberances that extend from the first stator body 250 in a direction parallel to the first (X) axis, such that the gap in each of the first capacitive pairs has a long dimension oriented along the first axis.

The first rotors 204 and first stators 212 are positioned relative to one another so as to form a plurality of first capacitive pairs, wherein each of the first capacitive pairs is formed by a respective one of the first rotors 204 and first stators 212. The first rotors 204 and first stators 212 are also configured such that an equal number of first capacitive pairs are formed on opposing first and second sides of the first stator body 250. In the illustrated embodiment, the opposing first and second sides of the stator body 250 are oriented parallel (or substantially parallel) to a second axis of the accelerometer 200 (in this case, the Y axis), but the accelerometers described herein are not limited to that configuration.

The second electrode C2 is disposed proximate a second side of the proof mass 102 that is opposite or substantially opposite the first side of the proof mass 102. Similar to the first electrode C1, the second electrode C2 includes a second rotor set and a second stator set. The second rotor set includes a plurality of second rotors 204', and the second stator set includes a second stator body 260 and plurality of second stators 212'. The plurality of second rotors 204' are in the form of protuberances or "fingers" that extend from the proof mass in a direction parallel to the first (X) axis. Similarly, the plurality of second stators 212 are in the form of protuberances or "fingers" that extend from the second stator body 260 in a direction parallel to the first (X) axis.

Figure 2A:
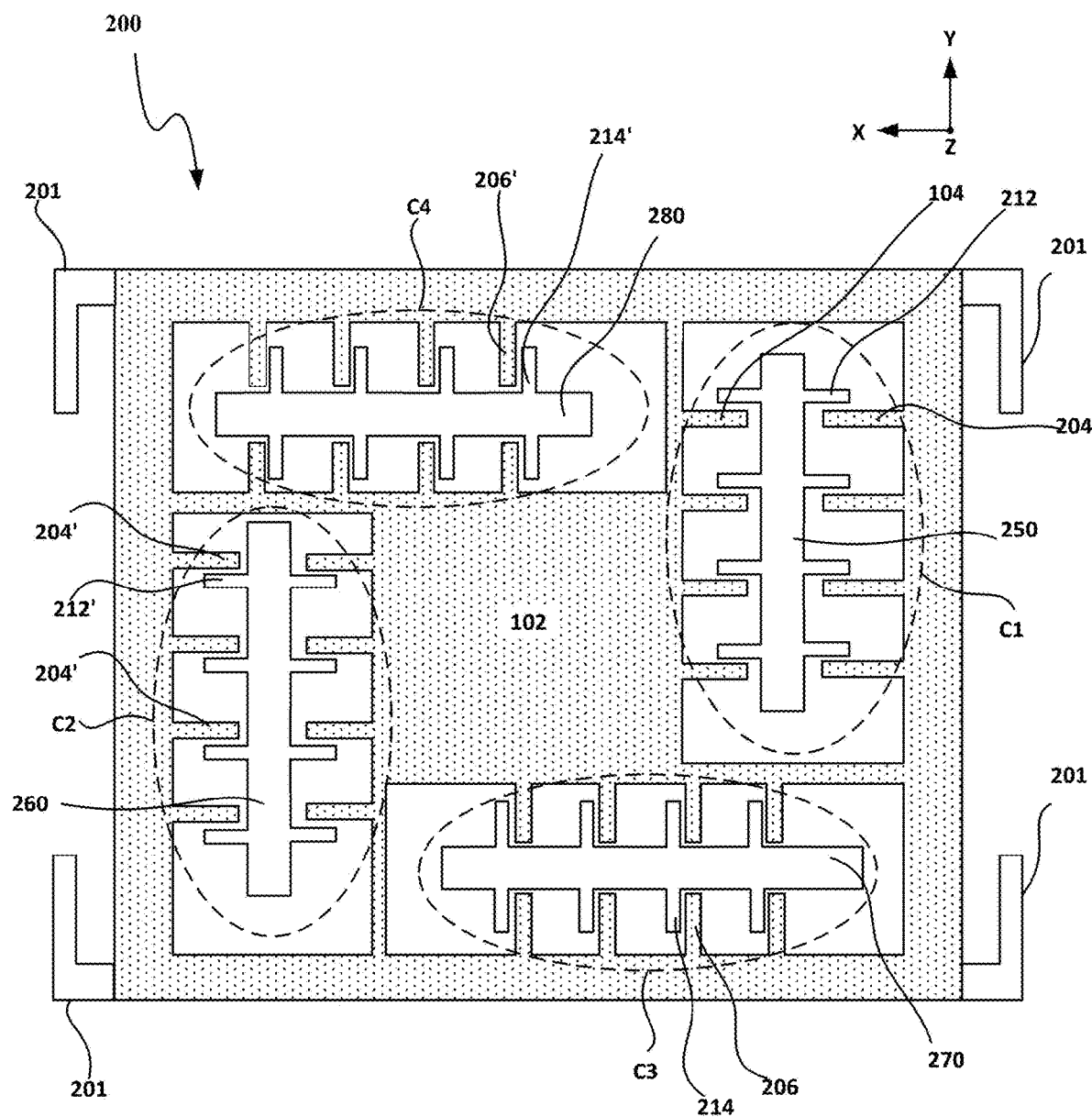
FIG. 2A is a plan view of another example of an accelerometer consistent with the present disclosure.
Figure 2B:
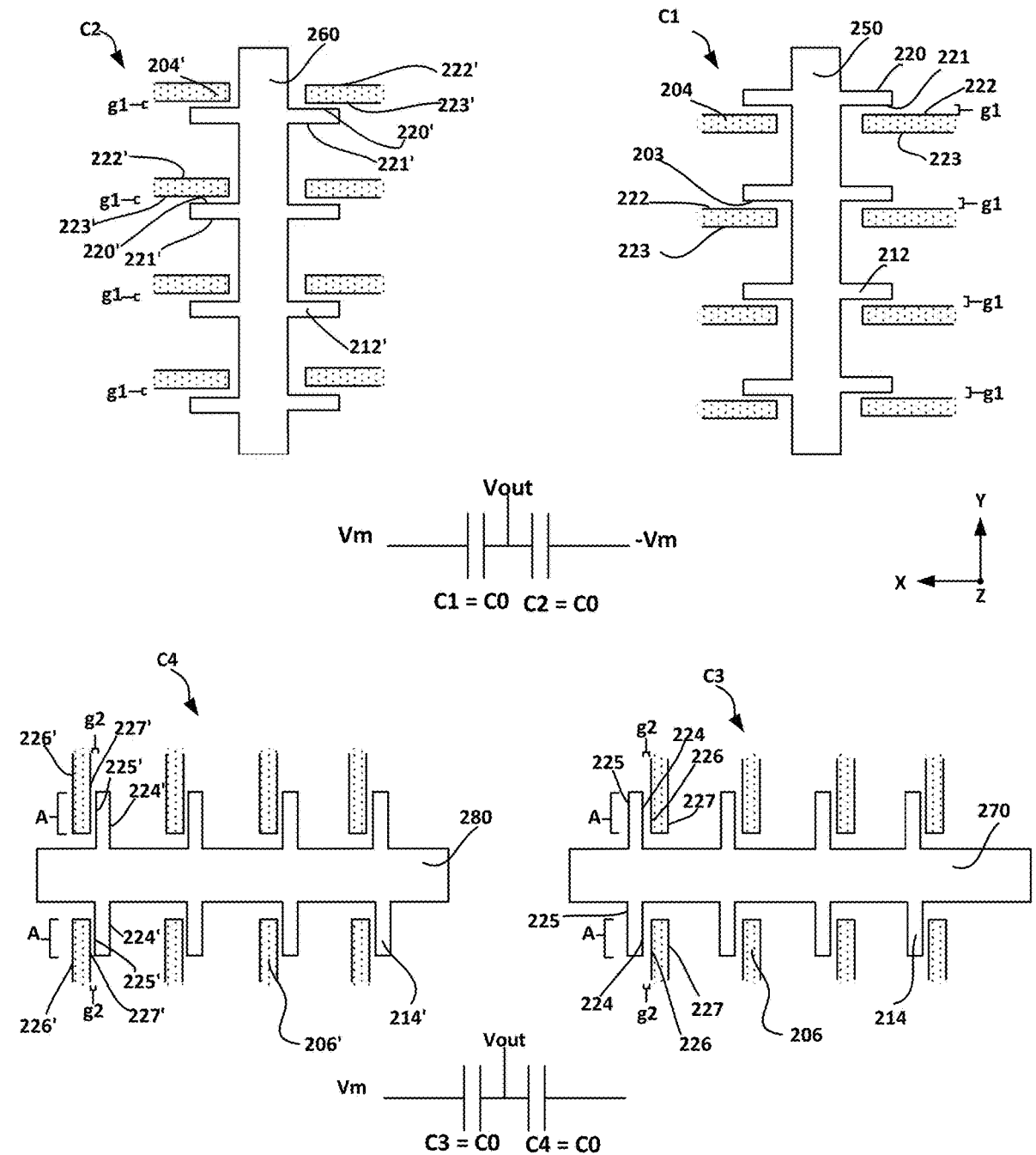
FIG. 2B is a magnified view of first (C1), second (C2), third (C3), and fourth (C4) electrodes of the accelerometer of FIG. 2A, in an at rest condition.

The second rotors 204' and second stators 212' are positioned relative to one another so as to form a plurality of second capacitive pairs, wherein each of the second capacitive pairs is formed by a respective one of the second rotors 204' and second stators 212'. Moreover, the second rotors 204' and second stators 212' are configured such that an equal number of capacitive pairs are formed on opposing first and second sides of second stator body 260. In this case, the opposing first and second sides of the second stator body 260 are oriented parallel (or substantially parallel) to the second (Y) axis of the accelerometer 200, but the accelerometers described herein are not limited to that configuration. The second rotors 204' and second stators 212' are also configured such that a gap of each of the second capacitive pairs has a long dimension oriented along the first (X) axis of the accelerometer. As best shown in FIG. 2B, the gap may have a default gap width g1 when the accelerometer 200 is at rest. The gap width g1 may change in response to a force applied along the second (Y) axis of the accelerometer, but may remain unchanged (or substantially unchanged) by a force applied along the first (X) axis of the accelerometer) and/or a third (e.g., Z) axis of the accelerometer.

The number of first and second capacitive pairs in the first and second electrodes C1 and C2 is not limited, provided that the number of first and second capacitive pairs is the same. For the sake of illustration, FIGS. 2A, 2B, and 2C illustrate an embodiment in which the first and second electrodes C1 and C2 each include 8 capacitive pairs, with 4 capacitive pairs located on a first side of stator bodies 250, 260, and 4 capacitive pairs located on a second side of stator bodies 250, 260. Such illustration is for the sake of example only, and any suitable number of capacitive pairs may be used in the first and second electrodes C1, C2. For example, the first and second electrodes C1, C2 may each include 2, 4, 6, 8, 10, 12, 14, 16, 18, 20 or more capacitive pairs, with an equal number of capacitive pairs disposed on opposing sides of a corresponding stator body.

The first capacitive pairs of the first electrode C1 are configured differently from the second capacitive pairs of the second electrode C2. More specifically and as best shown in FIGS. 2B and 2C, first stators 212 are in the form of protuberances or "fingers" that have opposing first and second sides 220, 221, which in this case face the same direction and are oriented in parallel with the first (X) axis of accelerometer 200. Likewise, second stators 212' are in the form of protuberances or "fingers" that have opposing first and second sides 220', 221', and which also face the same direction and are oriented in parallel with the first (X) axis. Similarly, the first and second rotors 204, 204' are in the form or protuberances or "fingers" having a first side 222, 222' and an opposing second side (223, 223', respectively, which are oriented in parallel with the first (X) axis. Notably, the first rotors 204 in the first electrode C1 are positioned so that their first side 222 is positioned proximate to the second side 221 of a respective one of the first stators 212. In contrast, the second rotors 204' in the second electrode C2 are positioned so that their second side 223' is positioned proximate to the first side 220' of a respective one of the second stators 212'.

Put differently, the first and second stators 212, 212' may be understood as each having opposing positive and negative sides, which face the same direction and are oriented in parallel with a first (X) axis of the accelerometer. With that in mind, the first rotors 204 of the first electrode C1 are positioned proximate the positive side of a corresponding one of the first stators 212, whereas the second rotors 204' of the second electrode C2 are positioned proximate the negative side of a corresponding one of the second stators 212'. As will be further explained, that configuration can allow a detectable change in differential capacitance between C1 and C2 to arise when a force is applied only along a second (Y) axis of the accelerometer, but limits or prevents a change in differential capacitance between C1 and C2 when a force is applied only along a first (e.g., X) axis of the accelerometer.

The third electrode C3 is disposed proximate a third side of the proof mass 102 that is orthogonal or substantially orthogonal to the first and second sides of the proof mass 102. Similar to the first and second electrodes, the third electrode C3 includes a third rotor set and a third stator set. The third rotor set includes a plurality of third rotors 206, and the third stator set includes a third stator body 270 and plurality of third stators 214. The plurality of third rotors 206 are in the form of protuberances or "fingers" that extend from the proof mass in a direction parallel to the second (Y) axis of the accelerometer 200. Similarly, the plurality of third stators 214 are in the form of protuberances or "fingers" that extend from the third stator body 270 in a direction parallel to the second (Y) axis of the accelerometer.

The third rotors 206 and third stators 214 are positioned relative to one another so as to form a plurality of third capacitive pairs, wherein each of the third capacitive pairs is formed by a respective one of the third rotors 206 and third stators 214. The third rotors 206 and third stators 214 are also configured such that an equal number of third capacitive pairs are formed on opposing first and second sides of third stator body 270. In this case, the opposing first and second sides of the third stator body 270 are oriented parallel (or substantially parallel) to the first (X) axis of the accelerometer 200, but the accelerometers described herein are not limited to that configuration. The third rotors 206 and third stators 214 are also configured such that a gap of each of the first capacitive pairs has a long dimension oriented along the second (Y) axis of the accelerometer. As best shown in FIG. 2B, the gap may have a default gap width g2 when the accelerometer 200 is at rest. That gap width may change in response to a force applied along the first (X) axis of the accelerometer, but may remain unchanged (or substantially unchanged) by a force applied along the second (Y) axis of the accelerometer) and/or a third (e.g., Z) axis of the accelerometer.

The fourth electrode C4 is disposed proximate a second side of the proof mass 102 that is opposite or substantially opposite the third side of the proof mass 102. Similar to the third electrode C3, the fourth electrode C4 includes a fourth rotor set and a fourth stator set. The fourth rotor set includes a plurality of fourth rotors 206', and the fourth stator set includes a fourth stator body 280 and plurality of fourth stators 214'. The plurality of fourth rotors 206' are in the form of protuberances or "fingers" that extend from the proof mass 202 in a direction parallel to the second (Y) axis of the accelerometer. Similarly, the plurality of fourth stators 214' are in the form of protuberances or "fingers" that extend from the second stator body 280 in a direction parallel to the second (Y) axis of the accelerometer.

The fourth rotors 206' and fourth stators 214' are positioned relative to one another so as to form a plurality of fourth capacitive pairs, wherein each of the fourth capacitive pairs is formed by a respective one of the fourth rotors 206' and fourth stators 214'. Moreover, the fourth rotors 206' and fourth stators 214' are configured such that an equal number of capacitive pairs are formed on opposing first and second sides of fourth stator body 280. In this case, the opposing first and second sides of the fourth stator body 280 are oriented parallel (or substantially parallel) to the first (X) axis of the accelerometer 200, but the accelerometers described herein are not limited to that configuration. The fourth rotors 206' and fourth stators 214' are also configured such that a gap of each of the second capacitive pairs has a long dimension oriented along the second (Y) axis of the accelerometer.

Figure 2D:
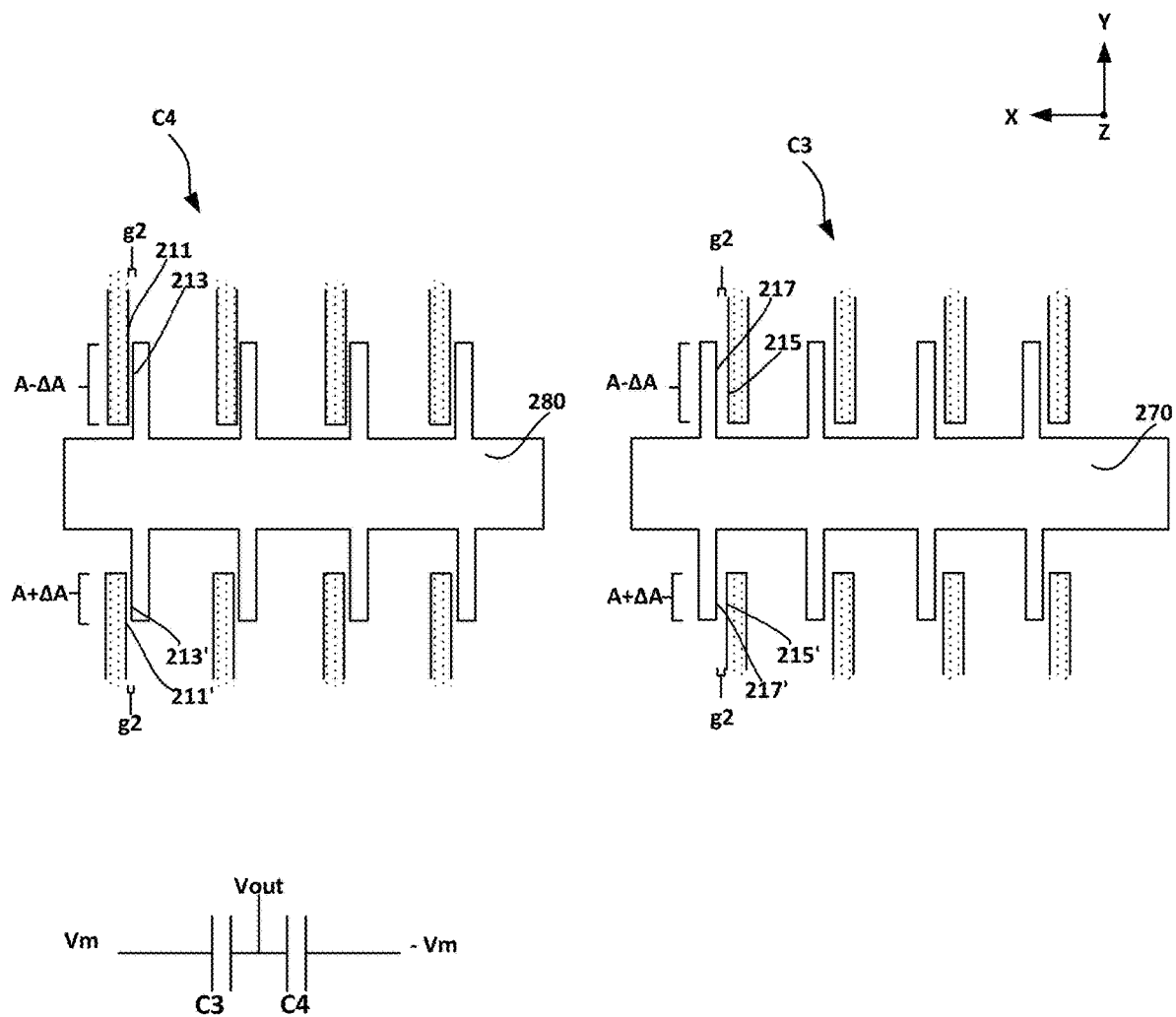
FIG. 2D is a magnified view of the third and fourth electrodes of the accelerometer of FIG. 2A, when a force is applied along one (e.g., negative Y) axis.

The number of third and fourth capacitive pairs in the third and fourth electrodes C3 and C4 is not limited, provided that the number of third and fourth capacitive pairs is the same and an equal number of capacitive pairs can be positioned on opposing sides of a corresponding stator body. For the sake of illustration, FIGS. 2A, 2B, and 2D illustrate an embodiment in which the third and fourth electrodes C3 and C4 each include 8 capacitive pairs, with 4 capacitive pairs located on a first side of stator bodies 270, 280, and 4 capacitive pairs located on a second side of stator bodies 270, 280. Such illustration is for the sake of example only, and any suitable number of capacitive pairs may be used in the third and fourth electrodes C3, C4. For example, the third and fourth electrodes, C3, C4 may each include 2, 4, 6, 8, 10, 12, 14, 16, 18, 20 or more capacitive pairs, wherein an equal number of capacitive pairs are formed on opposing sides of a corresponding stator body.

The third capacitive pairs of the third electrode C3 are configured differently from the fourth capacitive pairs of the fourth electrode C4. More specifically and as best shown in FIGS. 2B and 2D, third stators 214 are in the form of protuberances or "fingers" that have opposing first and second sides 224, 225, which face the same direction and are oriented in parallel with the second (Y) axis of accelerometer 200. Likewise, fourth stators 214' are in the form of protuberances or "fingers" that have opposing first and second sides 224', 225', which also face the same direction and are oriented in parallel with the second (Y) axis. Similarly, the third and fourth rotors 206, 206' are in the form or protuberances or "fingers" having a first side 226, 226' and an opposing second side 227, 227', respectively, which face the same direction and are oriented parallel to the second (Y) axis. Notably, the third rotors 206 in the third electrode C3 are positioned so that their first side 226 is positioned proximate to the first side 224 of a respective one of the third stators 214. In contrast, the fourth rotors 206' in the fourth electrode C4 are positioned so that their second side 227' is positioned proximate to the second side 225' of a respective one of the second stators 212'.

Put differently, the third and fourth stators 214, 214' may be understood as each having opposing positive and negative sides, which face the same direction and are oriented in parallel with the second (Y) axis of the accelerometer 200. With that in mind, the third rotors 206 of the third electrode C3 are positioned proximate the positive side of a corresponding one of the third stators 214, whereas the fourth rotors 206' of the fourth electrode C4 are positioned proximate the negative side of a corresponding one of the fourth stators 214'. As will be further explained, that configuration can allow a detectable change in differential capacitance between C3 and C4 to arise when a force is applied only along the first (X) axis of the accelerometer, but limits or prevents a change in differential capacitance between C3 and C4 when a force is applied only along the second (Y) axis of the accelerometer.

Returning to FIG. 2A, the accelerometer 200 includes one or more of elastic members 201 that suspend or support the proof mass and rotors of electrodes C1-C4 from or above a substrate (not shown). Any suitable elastic member may be used as elastic member(s) 201. Non-limiting examples of suitable elastic members that may be used as elastic member(s) 201 include springs, struts, or other suitable structures. Without limitation, in embodiments elastic members 201 are crab leg springs that support or suspend proof mass and the rotors of C1-C4 above or from a substrate. When used, such crab leg springs may be integral with the underlying substrate, and may be formed by photolithography or another suitable process from the material of the substrate. While various FIGS. show embodiments in which four elastic members 201 are used, such illustration is for the sake of example only and the accelerometers described herein are not limited thereto. Indeed the accelerometers described herein may utilize any suitable number of elastic members to support or suspend the proof mass 102 and the rotors of electrodes C1-C4 above or from an underlying substrate.

In any case, elastic members 201 are generally configured to allow the proof mass and rotors to move in response to an applied force. Movement of the rotors relative to the stators may cause a detectable change in differential capacitance to arise between C1 and C2 or C3 and C4, which in turn may be used to determine the acceleration applied along the second (e.g., Y) and first (e.g., X) axes, respectively. In contrast, the stator bodies and stators of electrodes C1-C4 may be integral with or otherwise attached to the underlying substrate, so as to limit or prevent their displacement in response to an applied force.

For the sake of illustration and ease of understanding, the general operating principals of accelerometers consistent with the present disclosure will now be described in connection with FIGS. 2B-2D, assuming the application of a force to accelerometer 200 only along the negative Y axis direction, which displaces the proof mass 102 (and associated rotors) along the positive Y axis direction.

As noted above, prior to the application of a force (i.e., when accelerometer 200 is at rest), the proof mass 102 is at rest and the capacitance of the C1, C2, C3, and C4 is nominally equal to the static capacitance, $C_0$. That concept is shown in FIG. 2B, which shows that the first and second capacitive pairs in the first and second electrodes C1, C2, have a default gap spacing g1 in the at rest condition. The rotors and stators of the first and second capacitive pairs overlap to a default degree in the at rest condition. Similarly, FIG. 2B shows that in the at rest condition, the third and fourth capacitive pairs in the third and fourth electrodes C3, C4 have a default gap spacing g2, and an effective capacitance area A. Notably, g1 and the effective capacitive area of the first electrode C1 is the same as g1 and the effective capacitive area of the second electrode C2. Likewise, g2 and the effective capacitive area A of the third electrode C3 is the same as g2 and the effective capacitive area A of the fourth electrode. Thus, in the at rest condition, the capacitance of each of the electrodes C1, C2, C3, and C4 is equal to $C_0$. As a result, no voltage will be measured at the output of the first electrode set (C1, C2) or the second electrode set (C3, C4), as shown by equation II below:

$$V_r = V_m\left[\frac{(C_a - C_b)}{(C_a + C_{2b})}\right] = V_m\left[\frac{(C_0 - C_0)}{(2C_0)}\right] = 0 \tag{II}$$

Where $C_a$ and $C_b$ are the capacitance of electrodes C1 and C2 or electrodes C3 and C4, respectively, and $V_m$ is a measuring voltage.

Turning now to FIG. 2C, when a force is applied along the negative Y axis direction, the first rotors 204 of C1 are displaced by a distance x toward their corresponding stator 212, and the second rotors 204' of C2 are displaced away from their corresponding stator 212' by x. As a result, the gap spacing of the first capacitive pairs in C1 decreases to g1−x, whereas the gap spacing of the second capacitive pairs in C2 increases to g1+x. Consequently, the capacitance ($C_1$) of the first electrode C1 increases and the capacitance ($C_2$) of the second electrode decreases, as shown by equations III and IV below:

$$C_1 = \frac{\varepsilon \times A}{g1 - x} \tag{III}$$

$$C_2 = \frac{\varepsilon \times A}{g1 + x} \tag{IV}$$

Where $\varepsilon$ is the permittivity, A is the effective capacitive area between the first/second rotors and stators of the first or second capacitive pairs, g1 is the gap spacing, and x is the displacement of the first/second rotors in response to the force applied in the Y axis direction. Based on the differential capacitance of the first and second electrodes C1, C2, the voltage at the output for the first electrode set is given by equation V below:

$$V_{Y(AY)} = \frac{(C_1 - C_2)}{(C_1 + C_2)} \times V_m = \frac{\Delta C}{C_0} \times V_m \tag{V}$$

Where $V_{Y(AY)}$ is the voltage output for the first electrode set (C1, C2) due to acceleration along the Y axis direction, $\Delta C$ is the differential capacitance between C1 and C2, and the other symbols are as defined above for equations III and IV. Because $\Delta C$ is non-zero, $V_{Y(AY)}$ is non-zero and is representative of the acceleration applied along the Y axis due to the force applied in the negative Y direction.

Turning now to FIG. 2D, when a force is applied along the negative Y axis direction, the third rotors 206 of C3 are displaced relative to third stator body 270 and the fourth rotors 206' of C4 are displaced relative to fourth stator body 280, but the gap spacing g2 of the third and fourth capacitive pairs does not change. As a result, the capacitive area of the third capacitive pairs on one side of the third stator body 270 changes by an amount, −ΔA, and the capacitive area on the other side of the third stator body 270 changes by an amount, +ΔA. Likewise, the capacitive area of the fourth capacitive pairs on one side of the fourth stator body 280 changes by −ΔA, and the capacitive area on the other side of the fourth stator body 280 changes by +ΔA. Hence, the total effective capacitive area (A) of C3 and C4 and the gap spacing g2 remains constant and the capacitance of C3 and C4 will each equal $C_0$. Thus, based on the differential capacitance of the third and fourth electrodes C3, C4, the voltage of the output of the second electrode set (C3, C4) due to acceleration along the negative Y axis (i.e., due to cross axis sensitivity) is given by equation VI below:

$$V_{X(AY)} = \frac{(C_3 - C_4)}{(C_3 + C_4)} \times V_m = \frac{C_0 - C_0}{2C_0} \times V_m = \frac{0}{2C_0} = 0 \quad \text{(VI)}$$

Wherein $V_{X(AY)}$ is the voltage of the second electrode set due to acceleration along the negative Y axis direction, $C_3$ and $C_4$ are the capacitance of C3 and C4, and $V_m$ is a measurement voltage. As can be seen, $V_{X(AY)}$ is 0, meaning that the accelerometer exhibits 0 cross-axis sensitivity in the X dimension in response to a force applied along only the negative Y axis. The net capacitance change of the first electrode set (C1, C2) introduced by a force applied along only the X axis is cancelled in the same manner.

With regard to cross axis sensitivity for a force applied along the Z axis, although the stiffness coefficient (spring constant) of the elastic member may be significantly greater in the Z axis than along the X and/or Y axes, a force applied on the Z axis may also cause a small displacement of the rotors in the first through fourth electrodes in the Z direction. As a result, the effective capacitive area of each of C1, C2, C3, and C4 will be reduced by ΔC, resulting in a corresponding reducing in their capacitance. The change in capacitance of C1, C2, C3, and C4 may be equal and have the same sign. Thus, for example, based on the differential capacitance of the first, second, third and fourth electrodes C1, C2, C3, C4, the voltage of the output of the second electrode set (C3, C4) due to acceleration along the Z axis (i.e., due to cross axis sensitivity) is given by equation VII below:

$$V_{X(AZ)} = \frac{(C_3 - C_4)}{(C_3 + C_4)} \times V_m = \frac{(C_0 - \Delta C) - (C_0 - \Delta C)}{2C_0} \times V_m = \frac{0}{2C_0} = 0 \quad \text{(VII)}$$

Where $V_{X(AZ)}$ is the voltage of the second electrode set (C3, C4) due to acceleration in the Z dimension, and the other variables are as defined above. The net capacitance change of the first electrode set (C1, C2) introduced by a force applied along only the Z axis is cancelled in the same manner.

As explained above the accelerometers described herein utilize the difference in the capacitance sensed between two or more electrodes in an electrode set to determine acceleration along one or more axes. In that regard the accelerometers described herein may include or be coupled to a measurement unit that is configured to determine the differential capacitance between electrodes in an electrode set. The measurement unit may be or include, for example, a controller (e.g., microcontroller) that is configured to apply a measurement voltage ($V_m$) across the electrodes in an electrode set (e.g., across C1, C2 or C3, C4), and to determine the differential capacitance between those electrodes in response to the application of $V_m$. In embodiments, the measurement unit include a voltage generator that is configured to generate the measurement voltage and detection circuitry configured to determine the capacitance (and/or differential capacitance) between electrodes in an electrode set in response to the applying of $V_m$. In further embodiments, the detection circuitry may include an amplifier or means for amplifying signals measured from electrodes in an electrode set, and circuitry for determining the capacitance (and/or differential capacitance) between electrodes in an electrode set based on the amplified or unamplified signal(s).

FIGS. 3A, 3B, and 3C show example mode shapes exhibited by an accelerometer consistent with the present disclosure. The mode shape exhibited by such an example accelerometer when a proof mass 102 and rotors integral with or coupled thereto are translated along the X axis is shown in FIG. 3A. The mode shape exhibited by the example when the proof mass 102 and the rotors integral with or coupled thereto are translated along the Y axis is shown in FIG. 3B. And the mode shape of the example when the proof mass 102 and the rotors integral with or coupled thereto are rotated about the z-axis is shown in FIG. 3C.

EXAMPLE

To investigate the efficacy of the multi-axis accelerometer designs discussed herein, a multi-axis accelerometer consistent with the design of FIG. 2A was constructed using to the parameter shown in Table 1 below:

TABLE 1

| Design | Elastic member Crab leg springs |
|---|---|
| Stiffness coefficient (x dimension - Newtons/Meter) | 59.47 |
| Stiffness coefficient (y dimension- Newtons/Meter) | 59.69 |
| Stiffness coefficient (z dimension - Newtons/Meter) | 279 |
| Beam length (microns) | 300 |
| Beam width (microns) | 7 |
| Beam thickness (microns) | 30 |

| | Electrode Design | |
|---|---|---|
| | 1st Electrode Set (C1, C2) | 2nd Electrode Set (C1, C2) |
| Static Capacitance (Pico farad) | 5.16 | 5.16 |
| Rotor/Stator Length (microns) | 82 | 82 |
| Rotor/Stator Width (microns) | 5 | 5 |
| Rotor/Stator Thickness (microns) | 30 | 30 |
| Gap spacing (g1, g2 - microns) | 1.25 (g1) | 1.25 (g2) |
| Natural Frequency (kilohertz) | 3.784 kHz | 3.791 kHz |
| Cross-Axis sensitivity_X | 0 | 0 |
| Cross-Axis sensitivity_Y | 0 | 0 |
| Cross-Axis sensitivity_Z | 0 | 0 |

Figure 4:
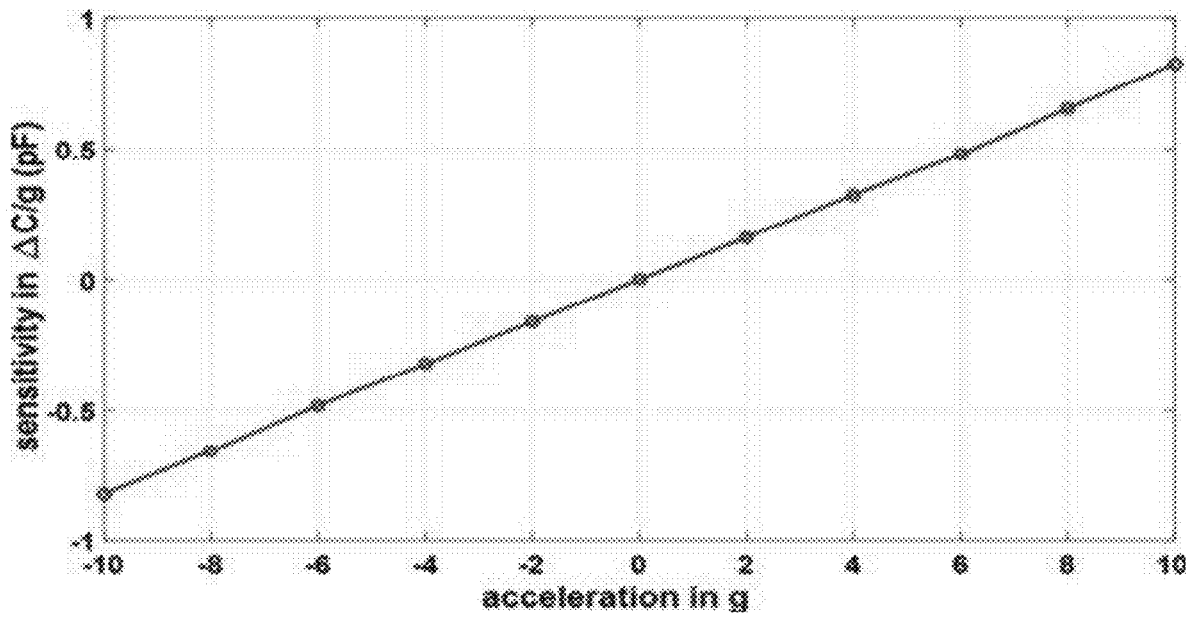
FIG. 4 is a plot of differential capacitance versus acceleration along a y axis for one example of an accelerometer consistent with embodiments of the present disclosure.
Figure 5:
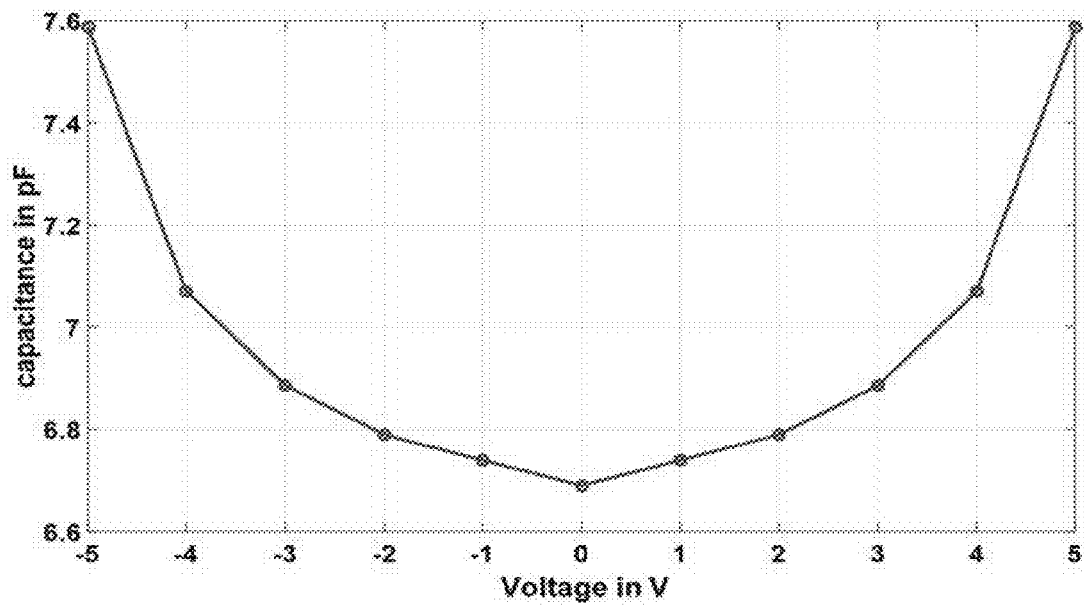
FIG. 5 is a plot of proof mass displacement versus voltage for one example of an accelerometer consistent with embodiments of the present disclosure.

The differential capacitive sensitivity (ΔC/g) of the example accelerometer was calculated to be 80.9 femto Farads/g. As the accelerometer operates on a gap changing principal (i.e., a change in the gap spacing g1, g2 of the first and second electrode sets), the response of the accelerometer was non-linear at high g accelerations, but as shown in FIG. 4, the sensitivity was linear in a range of +/−10 g. The non-linear response at high g accelerations is believed to be attributable to increases in the pull-in voltage of the accelerometer as the displacement of the rotors in the electrode sets increases beyond a threshold amount. This is reflected in FIG. 5, which is a plot of the rotor displacement versus pull in voltage. As shown, the pull-in voltage of the example accelerometer increased with increasing rotor displacement. The example accelerometer exhibited a maximum pull-in voltage of about 6 V.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A multi-axis accelerometer comprising:
   a proof mass comprising:
      a first side, a second side, a third side, and a fourth side, wherein said first and said third sides are generally parallel to each other and wherein said second and said fourth sides are generally parallel to each other and orthogonal to the first side;
      a first opening having a first longitudinal axis extending along said first side;
      a second opening having a second longitudinal axis extending along said second side;
      a third opening having a third longitudinal axis extending along said third side; and
      a fourth opening having a fourth longitudinal axis extending along said fourth side;
   a first electrode set configured to detect acceleration along a second axis of the accelerometer, the first electrode set comprising a first electrode (C1) and a second electrode (C2), C1 comprising a first rotor set and a first stator set, the first rotor set including a plurality of rotor fingers extending from two opposite sidewalls of the first opening, the first stator set comprising a first stator body disposed within the first opening and including a plurality of stator fingers extending from the first stator body generally towards the two opposite sidewalls of the first opening, C2 comprising a second rotor set and a second stator set, the second rotor set including a plurality of rotor fingers extending from two opposite sidewalls of the second opening, the second stator set comprising a second stator body disposed within the second opening and including a plurality of stator fingers extending from the second stator body generally towards the two opposite sidewalls of the second opening;
   a second electrode set configured to detect acceleration along a first axis of the accelerometer that is orthogonal to the second axis, the second electrode set comprising a third electrode (C3) and a fourth electrode (C4), C3 comprising a third rotor set and a third stator set, the third rotor set including a plurality of rotor fingers extending from two opposite sidewalls of the third opening, the third stator set comprising a third stator body disposed within the third opening and including a plurality of stator fingers extending from the third stator body generally towards the two opposite sidewalls of the third opening, C4 comprising a fourth rotor set and a fourth stator set, the fourth rotor set including a plurality of rotor fingers extending from two opposite sidewalls of the fourth opening, the fourth stator set comprising a fourth stator body disposed within the fourth opening and including a plurality of stator fingers extending from the fourth stator body generally towards the two opposite sidewalls of the fourth opening;
   wherein the first and second electrode sets are configured such that in response to a force applied only along the second axis of the accelerometer:
      a non-zero change in differential capacitance is exhibited between at least C1 and C2, the non-zero net change in differential capacitance corresponding to acceleration along the second axis due to the force applied only along the second axis; and
      a zero net change in differential capacitance is exhibited between at least C3 and C4.

2. The multi-axis accelerometer of claim 1, wherein the first and second electrode sets are configured such that in response to a force applied only along the first axis of the accelerometer:
   a non-zero change in differential capacitance is exhibited between at least C3 and C4, the non-zero net change in differential capacitance corresponding to acceleration along the first axis due to the force applied only along the first axis; and
   a zero net change in differential capacitance is exhibited between at least C1 and C2.

3. The multi-axis accelerometer of claim 2, wherein:
   the first and second electrode sets are configured such that a zero net change in differential capacitance is exhibited between at least C1 and C2 and between at least C3 and C4 in response to a force applied only along a third axis of the accelerometer; and
   the third axis is orthogonal to the first axis and the second axis.

4. The multi-axis accelerometer of claim 1, wherein:
   the accelerometer further comprises an elastic member and a substrate; and
   the elastic member is configured to support the plurality of rotors and the proof mass on the substrate, or to suspend the plurality of rotors fingers of C1, C2, C3, and C4 and the proof mass from the substrate.

5. The multi-axis accelerometer of claim 1, wherein:
   the plurality of rotor fingers of the first and second rotor sets and the plurality of stator fingers of the first and second stator sets are each spaced apart by one or more gaps in a direction parallel to the second axis.

6. The multi-axis accelerometer of claim 5, wherein:
   the plurality of rotor fingers of the third and fourth rotor sets and the plurality of stator fingers of the third and fourth stator sets are each spaced apart by one or more gaps in a direction parallel to the first axis.

7. The multi-axis accelerometer of claim 1, wherein:
   the plurality of rotor fingers of C1 extend from said proof mass;
   the plurality of rotor fingers of C2 extend from said proof mass;
   each of said plurality of rotor fingers of C1 is spaced apart from a respective one of said plurality of stator fingers of C1 by a first gap with an initial gap spacing g1, so as to define a plurality of first capacitive pairs;

each of said plurality of rotor fingers of C2 is spaced apart from a respective one of said plurality of stator fingers of C2 by a second gap with the initial gap spacing g1, so as to define a plurality of second capacitive pairs; and each of the plurality of plurality of rotor fingers of C1 and C2 is configured to move parallel to the second axis in response to the force applied along the second axis, such that the first gap decreases, and the second gap increases.

8. The multi-axis accelerometer of claim 7, wherein each of the plurality of stator fingers of C1 and C2 is integral with or coupled to the substrate, and are configured to remain stationary in response to application of the force along one or more axes of the accelerometer.

9. The multi-axis accelerometer of claim 7, wherein:
the plurality of rotor fingers of C3 extend from said proof mass;
the plurality of rotor fingers of C4 extend from said proof mass;
each of said plurality of rotor fingers of C3 is spaced apart from a respective one of said plurality of stator fingers of C3 by a third gap with an initial gap spacing g2, so as to define a plurality of third capacitive pairs;
each of said plurality of rotor fingers of C4 is spaced apart from a respective one of said plurality of stator fingers of C4 by a fourth gap with the initial gap spacing g2, so as to define a plurality of fourth capacitive pairs; and
each of the plurality of plurality of rotor fingers of C3 and C4 is configured to move parallel to the first axis in response to the force applied only along the first axis.

10. The multi-axis accelerometer of claim 9, wherein each of the plurality of stator fingers of C3 and C4 is integral with or coupled to the substrate, and are configured to remain stationary in response to application of the force along one or more axes of the accelerometer.

11. The multi-axis accelerometer of claim 9, wherein:
the initial gap spacing g2 of the third and fourth gaps remains constant when the plurality of rotor fingers of C3 and C4 move in response to the force applied only along the second axis; and
a total effective capacitive area of the plurality of third and fourth capacitive pairs remains constant when the plurality of rotor fingers of C3 and C4 move in response to the force applied only along the second axis.

12. The multi-axis accelerometer of claim 7, wherein:
the plurality of stator fingers of C1 extend from opposing first and second sides of said first stator body and the plurality of stator fingers of C2 extend from opposing first and second sides of said second stator body;
the first side of the first stator body and the first side of the second stator body face the same direction and are oriented in parallel with the first axis of the accelerometer;
the second side of the first stator body and the second side of the second stator body face the same direction and are oriented in parallel with the first axis of the accelerometer;
a first subset of the plurality of rotor fingers of C1 are positioned proximate the first side of the first stator body; and
a second subset of the plurality of rotor fingers of C2 are positioned proximate the second side of the second stator body.

13. The multi-axis accelerometer of claim 9, wherein:
the plurality of stator fingers of C3 extend from opposing first and second sides of said third stator body and the plurality of stator fingers of C4 extend from opposing first and second sides of said fourth stator body;
the first side of the third stator body and the first side of the fourth stator body face the same direction and are oriented in parallel with the second axis of the accelerometer;
the second side of the third stator body and the second side of the fourth stator body face the same direction and are oriented in parallel with the second axis of the accelerometer;
a third subset of the plurality of rotor fingers of C3 are positioned proximate the first side of the third stator body; and
a fourth subset of the plurality of rotor fingers of C4 are positioned proximate the second side of the plurality of fourth stator body.

14. The multi-axis accelerometer of claim 4, wherein the elastic member comprises at least one spring.

15. The multi-axis accelerometer of claim 14, wherein the at least one spring is a plurality of crab leg springs.

16. The multi-axis accelerometer of claim 1, further comprising a measurement unit, wherein the measurement unit is configured to:
apply a measurement voltage $V_m$ to C1, C2, C3, and C4;
determine a capacitance of C1, C2, C3, and C4; and
determine the differential capacitance between C1 and C2 and the differential capacitance between C3 and C4.

17. The multi-axis accelerometer of claim 16, wherein said measurement unit comprises a voltage generator for generating $V_m$.

18. The multi-axis accelerometer of claim 16, wherein said measurement unit comprises an amplifier to amplify signals representative of the capacitance of C1, C2, C3, and C4 to produce amplified signals, and circuitry to determine the differential capacitance of C1, C2 and the differential capacitance of C3, C4 from the amplified signals.

* * * * *